United States Patent [19]
Yamada et al.

[11] Patent Number: 5,470,392
[45] Date of Patent: Nov. 28, 1995

[54] SEMICONDUCTOR DEVICE PROCESSING METHOD

[75] Inventors: Yoshiaki Yamada; Junji Iwasaki; Masashi Ohmori, all of Itami, Japan

[73] Assignee: Mitsubishi Denki Kabushiki Kaisha, Tokyo, Japan

[21] Appl. No.: 340,350

[22] Filed: Nov. 14, 1994

Related U.S. Application Data

[62] Division of Ser. No. 970,471, Nov. 2, 1992, Pat. No. 5,383,482.

[30] Foreign Application Priority Data

Jul. 30, 1992 [JP] Japan ................................ 4-204068

[51] Int. Cl.⁶ .................................................. G03D 5/04
[52] U.S. Cl. ............................... 134/2; 134/32; 354/319
[58] Field of Search ............................ 134/2, 32, 42, 134/66, 79; 354/319; 414/404, 786

[56] References Cited

U.S. PATENT DOCUMENTS 4,568,234  2/1986  Lee et al. ........................ 414/404
4,658,960  4/1987  Iwasa ............................... 206/459
4,985,722  1/1991  Ushijima et al. ................ 134/66
5,030,057  7/1991  Nishi et al. ...................... 414/786

*Primary Examiner*—Scott Kastler
*Attorney, Agent, or Firm*—Leydig, Voit & Mayer

[57] ABSTRACT

A semiconductor processing method includes the steps of carrying a case containing semiconductor wafers and to which an ID card is attached into semiconductor processing equipment at a first side of the semiconductor processing equipment; removing the ID card from the case; taking the semiconductor wafers out of the case; carrying the semiconductor wafers taken out of the case into a processing means on a second side, opposite to the first side, of the semiconductor processing equipment; processing the semiconductor wafers in the processing means; attaching the ID card corresponding to the semiconductor wafers to the case; taking the processed semiconductor wafers out of the processing means at the first side of the semiconductor processing equipment; putting the processed semiconductor wafers into the case to which the ID card is attached; and carrying the case outside the semiconductor equipment at the first side of the semiconductor equipment.

10 Claims, 21 Drawing Sheets

SEMICONDUCTOR DEVICE PROCESSING METHOD

This disclosure is a division of application Ser. No. 07/970,471, filed Nov. 2, 1992, now U.S. Pat. No. 5,383,482.

BACKGROUND OF THE INVENTION

1. Field of the Invention

The present invention relates to a method and equipment for semiconductor processing, and to a semiconductor processing equipment module, especially for cleaning semiconductor wafers to achieve a total system which provides high efficiency FA (factory automation).

2. Description of the Related Art

FIG. 25 is a schematic diagram showing the structure of conventional semiconductor processing equipment such as (semiconductor) wafer cleaning equipment. In this figure, one or more wafer cassettes (not shown) are carried from the outside into wafer cleaning equipment 1 via a loader 2. A wafer taking-out unit 3 takes out only wafers (not shown) from the carried-in wafer cassettes. These wafers are wet-cleaned in a wafer cleaning bath 4. After the cleaning, a wafer inserting unit 5 inserts the wafers into a cassette containing no wafer in it (not shown, described as a vacant cassette hereafter). In the processing, a wafer carrying robot 7 holds wafers taken out by the above wafer taking-out unit 3, and carries them into the wafer cleaning bath 4. Furthermore, after the wafers are cleaned, the wafer carrying robot 7 carries the wafers to the wafer inserting unit 5. Cassettes containing cleaned wafers (not shown) are carried out of the wafer cleaning equipment 1 via an unloader 6.

The operation of a conventional wafer cleaning equipment having the structure shown above is described next. As shown in FIG. 13, when one through four product cassettes containing wafers to be cleaned are placed in the loader 2, the wafer taking-out unit 3 separates the wafers from the cassettes. Then, the wafers are carried to the cleaning bath 4 by the wafer carrying robot 7. The cassettes which became vacant are carried out of the wafer cleaning equipment 1 via the loader 2.

After the wafers are cleaned in the cleaning bath 4, the wafers are carried to the wafer inserting unit 5 by the wafer carrying robot 7. Then, the wafer inserting unit 5 inserts the wafers into vacant cassettes which are placed in an unloader 6 in advance. After that, the product cassettes containing the cleaned wafers are carried out of the wafer cleaning equipment 1 via the unloader 6.

The wafer cleaning equipment described above has a very limited function that it takes wafers out of product cassettes, performs wet cleaning for wafers, and inserts wafers back into product cassettes. As a result, further operations have to be performed at a certain place outside of the wafer cleaning equipment to remove and keep ID cards attached to product cassettes before wafers are carried into the wafer cleaning equipment. Moreover, it is also necessary, at a place outside the wafer cleaning equipment, to attach corresponding ID cards to product cassettes carried out of the wafer cleaning equipment after the wafers are cleaned. This prevents achievement of full factory automation (described by FFA hereafter) by robots.

Furthermore, in conventional wafer cleaning equipment, carrying products into the equipment and placing them into a cleaning bath are carried out on one same side of the equipment, but carrying products out STET the cleaning bath is done on the other side of the equipment. Therefore, to carry products in/out a cleaning bath, there must be plural carrying robots such as robots for carrying products into equipment before cleaning, robots for carrying products out of the equipment after cleaning, and robots for carrying vacant product cases from a location via which products to be cleaned are put into equipment to a location via which cleaned products are carried out. This gives rise to problems such as high costs for FA or large areas occupied by robots in clean rooms.

SUMMARY OF THE INVENTION

It is an object of the present invention to solve the problems described above. More specifically, it is an object of the present invention to provide a semiconductor processing method and equipment and a semiconductor processing equipment module to achieve high efficiency FA (factory automation) with small size equipment whereby perfect management of product cases and ID cards are performed.

In order to achieve the objects described above, the present invention provides semiconductor processing equipment which comprises: ID card removing means for removing an ID card from a case which contains semiconductor wafers and to which the ID card is attached; ID-card keeping means for keeping the removed ID card; processing means for processing semiconductor wafers; a loader which takes semiconductor wafers to be processed out of the cases and puts the semiconductor wafers in the processing means; ID-card attaching means which takes an ID card corresponding to semiconductor wafers processed already out of the ID-card keeping means and attaches the ID card to the case; and an unloader which takes processed semiconductor wafers from the processing means and puts the semiconductor wafers into the case.

The present invention also provides a semiconductor processing method which comprises the steps of: carrying a case, which contains semiconductor wafers and to which an ID card is attached, into semiconductor processing equipment from a first side of the semiconductor processing equipment; removing the ID card from the case; taking semiconductor wafers to be processed out of the cases; carrying the semiconductor wafers taken out of the cases into a processing means via a second side opposite to the first side of the semiconductor processing equipment; processing semiconductor wafers with the processing means; attaching the ID card corresponding to semiconductor wafers taken out of the case to the case; taking semiconductor wafers, which are processed already, out of the processing means via the first side of the semiconductor processing equipment; putting the semiconductor wafers, which are taken out of the processing means, into the case to which the ID card is attached; and carrying the case outside of the semiconductor equipment via the first side of the semiconductor equipment.

Furthermore, the present invention provides a semiconductor processing module which comprises:

plural pieces of semiconductor processing equipment comprising: ID card removing means for removing an ID card from a case which contains semiconductor wafers and to which the ID card is attached; ID-card keeping means for keeping the removed ID card; processing means for processing semiconductor wafers; a loader which takes semiconductor wafers to be processed out of the cases and puts the semiconductor wafers in the processing means; ID-card attaching means which takes an ID card corresponding to semiconductor wafers processed already out of the ID-card keeping means and attaches the ID card to the case; and an unloader which takes processed semiconductor wafers from the processing means and puts the semiconductor wafers into the case;

case stocking means for stocking cases; and case carrying means for carrying cases between the plural pieces of semiconductor processing equipments and the case stocking means.

DESCRIPTION OF THE PREFERRED EMBODIMENTS

Referring to the figures, semiconductor processing equipment of the present invention is described below.

Figure 1:
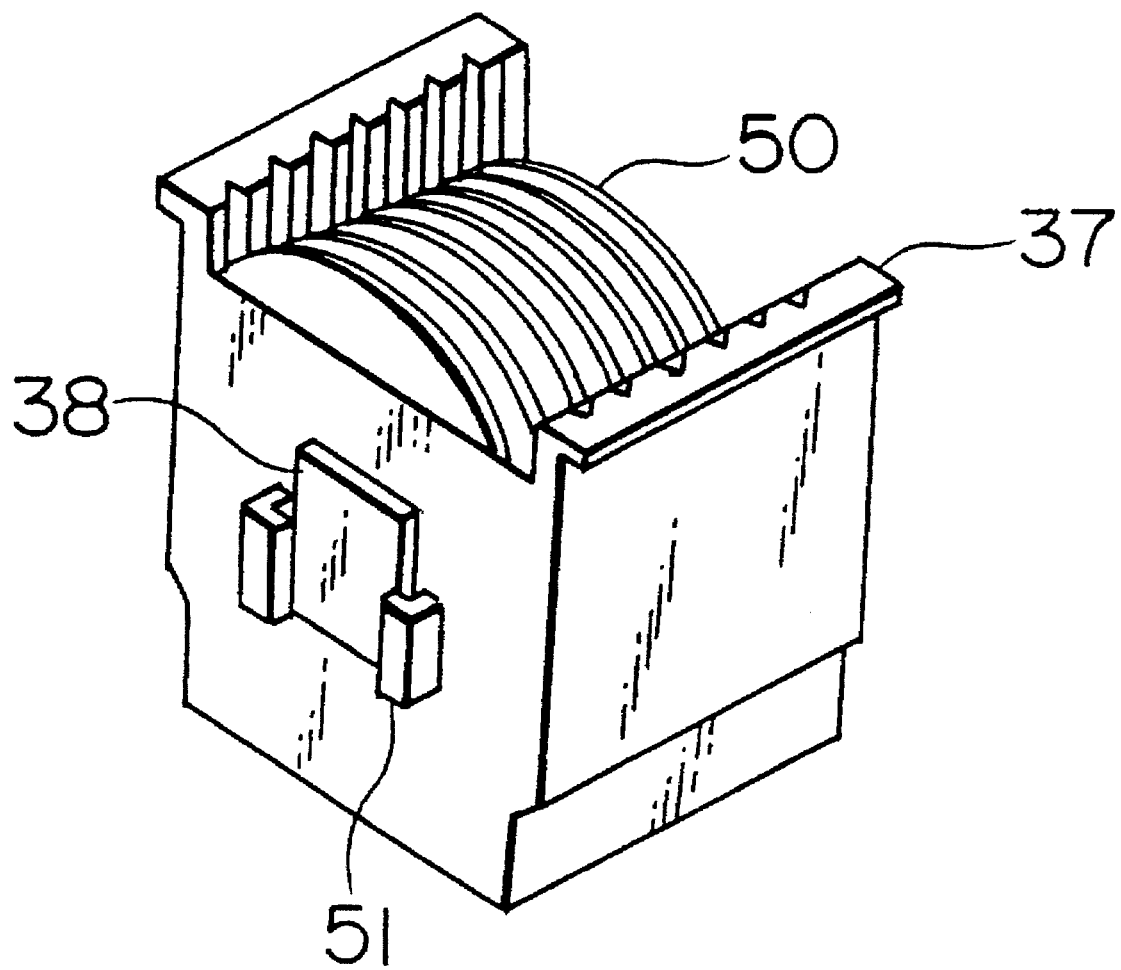
FIG. 1 is a perspective view of a cassette containing plural wafers.

FIG. 1 is a perspective view of a (product) case (product cassette, cassette) 37 for use in semiconductor processing equipment of the present invention. This cassette 37 is capable of containing plural wafers 50 and has a pocket 51 in which an ID card (product card) 38 is attached.

Figure 2:
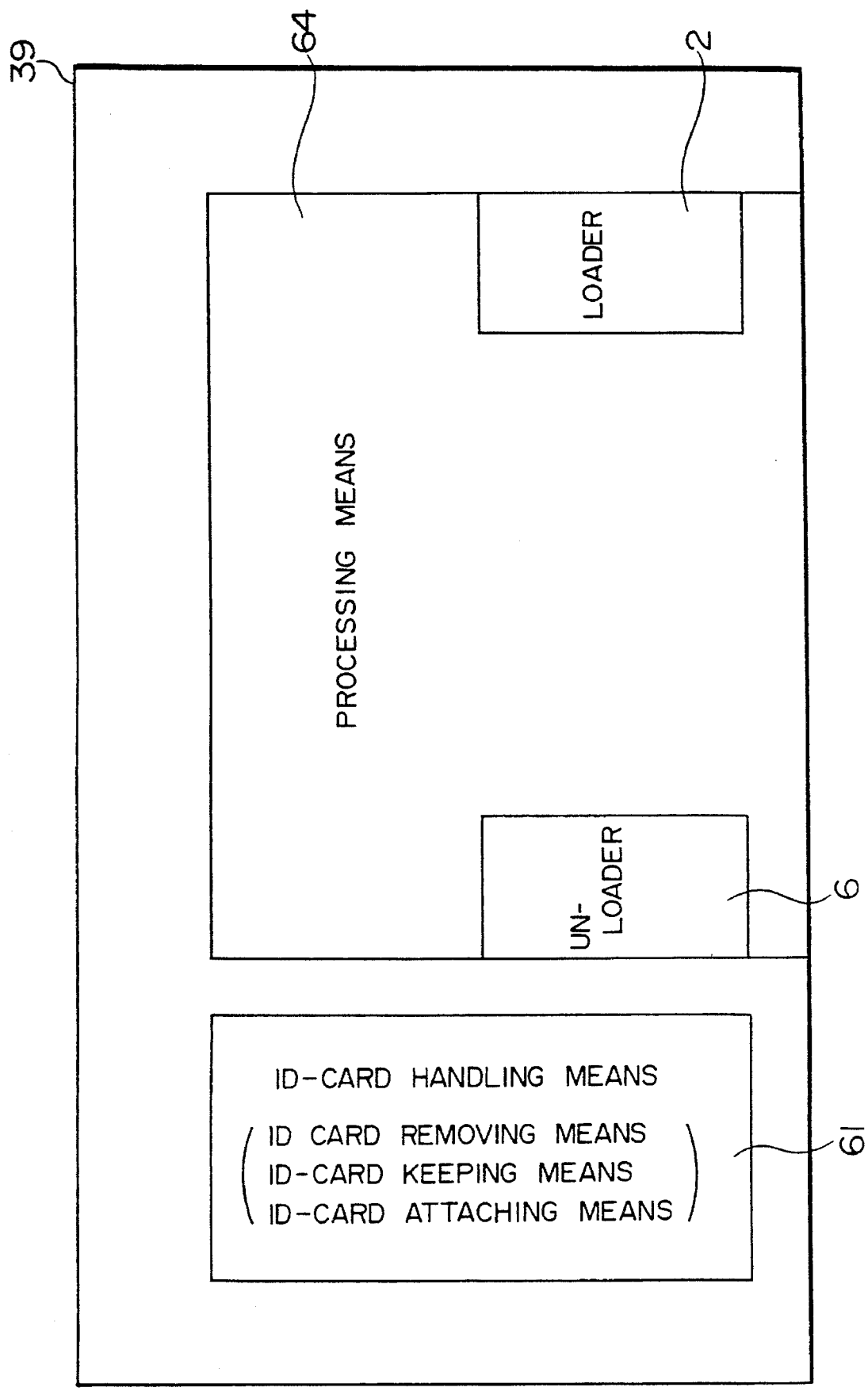
FIG. 2 is a schematic diagram showing an embodiment of semiconductor processing equipment of the present invention.

FIG. 2 is a schematic diagram showing an embodiment of semiconductor processing equipment of the present invention. The semiconductor processing equipment, such as wafer cleaning equipment 39 with capability of keeping ID cards, has an ID-card handling means 61 which comprises an ID-card removing means for removing an ID card 38 from a cassette (case) 37 shown in FIG. 1, an ID-card keeping means for keeping an removed ID card 38, an ID-card attaching means which takes an ID card 38 corresponding to processed wafers 50 from the ID-card keeping means and attaches it to the cassette 37. The wafer cleaning equipment 39 also has a processing means 64 for processing wafers 50, a loader 2 which takes wafers 50 to be processed from the cassette 37 and puts the wafers 50 into the processing means 64, and an unloader 6 which takes the processed wafers 50 from the processing means 64 and puts them into the cassette 37.

First Embodiment

Figure 3:
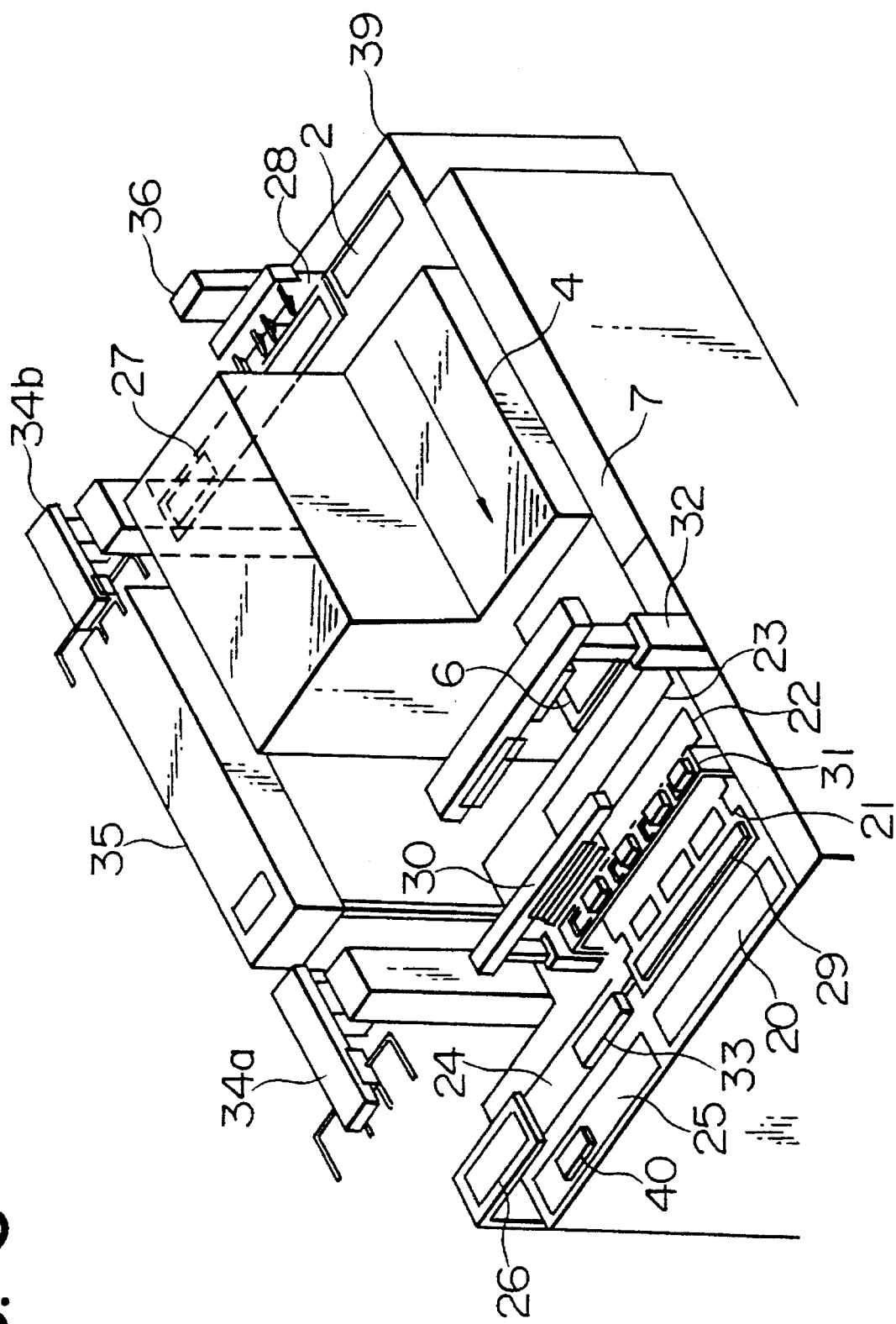
FIG. 3 is a schematic perspective view of wafer cleaning equipment of a first embodiment of the present invention.

In the following, referring to the figures, a first embodiment is described. FIG. 3 is a schematic perspective view of wafer cleaning equipment with a capability of holding ID cards. This wafer cleaning equipment 39 with the capability of holding ID cards has a carrying-in/carrying-out lane 20 for carrying in up to four cassettes 87 from outside or carrying them outside. It also has an ID-card handling robot 30 which takes an ID card 38 attached to a cassette 37 and inserts it into an ID-card stocker 31, an ID-card keeping means, and which takes an ID card 38 from the ID-card stocker 31 and inserts it into a cassette 37. Using an ID-card removing lane 21, this ID-card handling robot 30 functions as an ID-card removing means for taking an ID card 38 from a cassette 37. Furthermore, using an ID-card inserting lane 22, the ID-card handling robot 30 also functions as an ID-card attaching means for inserting an ID card 38 into a cassette 37.

For the sake of putting vacant cassettes on an unloader 6, there is an unloader waiting lane 23 where vacant cassettes wait for a while until the unloader 6 becomes capable of accepting vacant cassettes. Furthermore, there is a robot (d)

32 which is capable of carrying up to four cassettes between the carrying-in/carrying-out lane 20, the ID-card removing lane 21, the ID-card inserting lane 22, the unloader waiting lane 23, and the unloader 6. On the other hand, a slider 29 can carry up to four cassettes by sliding them between the ID-card removing lane 21, the card handling position just under the ID-card stocker 31, and the ID-card inserting lane 22. A slider 33 carries "cassettes containing wafers to be cleaned with no ID card"—it carries two cassettes at a time—from the ID-card removing lane 21 to a transfer lane 24. The transfer lane 24 has a capacity of up to four of such cassettes. A robot 34a carries up to two cassettes from the transfer lane 24 onto a conveyer 35, and also carries up to two vacant cassettes from the conveyer 35 either to a vacant-cassette buffer 26 or to a vacant-cassette carrying-out lane 25.

The conveyer 35 comprises a table and a driving unit. This table has a capacity of up to two cassettes. The driving unit drives this table such that the table slides back and forth between each end of the conveyer 35. A slider 40 carries up to two cassettes by sliding them on the vacant-cassette carrying-out lane 25. A robot 34b carries up to two cassettes between the conveyer 35 and a transfer lane 27. A robot 36 carries up to two cassettes between the transfer lane 27, a loader 2, and a loader waiting lane 28. Here, those robots which carry cassettes 37 on the equipment are part of a first case carrying means.

Figure 4:
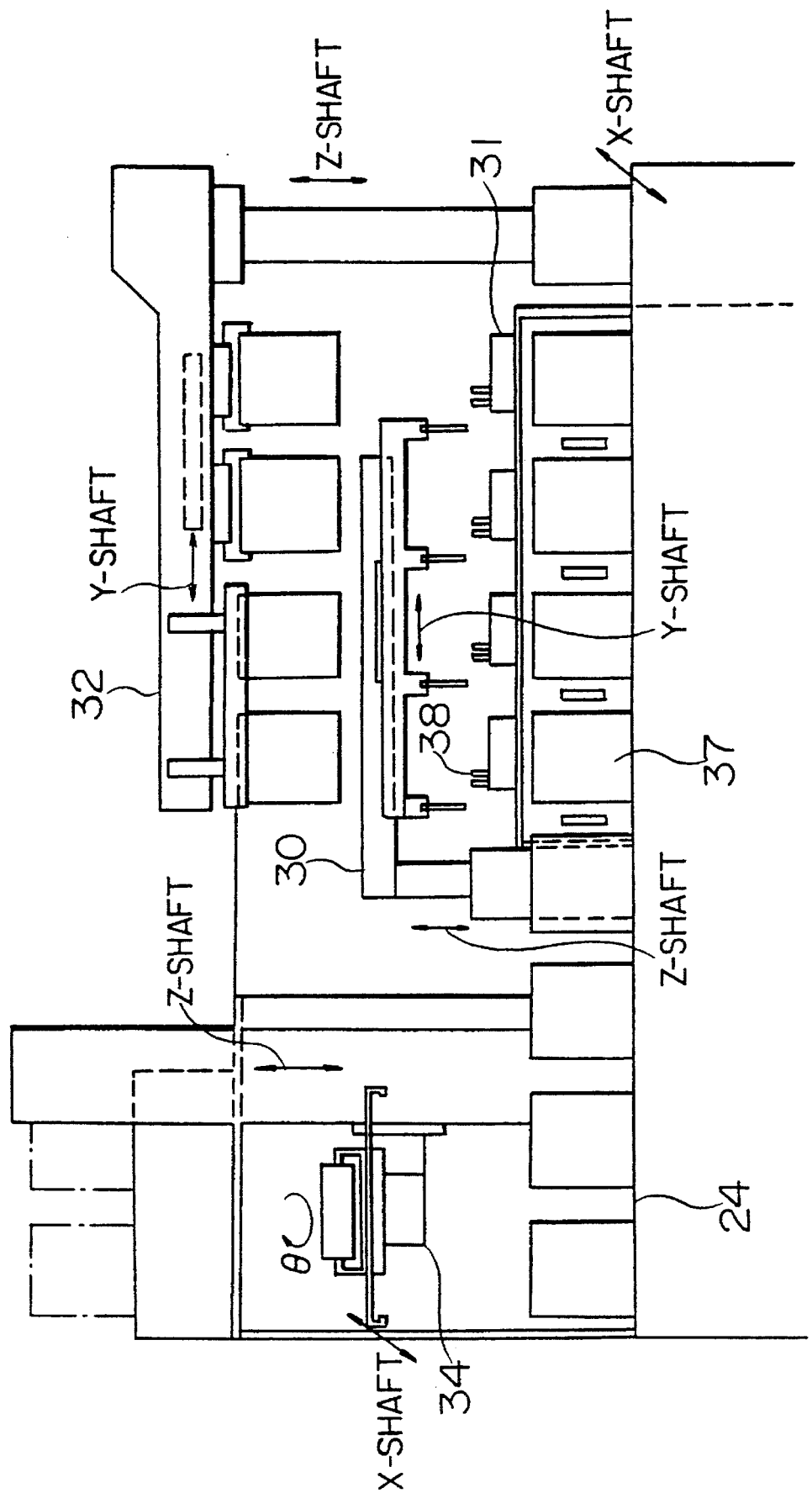
FIG. 4 is a schematic diagram for explanation of an ID-card handling robot.

FIG. 4 is a schematic diagram for explanation of the robot 32, the robot 34, and the ID-card handling robot 30.

The robot 32 comprises a X-shaft (a robot travelling shaft), a Y-shaft (a back-and-forth moving hand for holding two cassettes), a Z-shaft (up-and-down movement), and an opening/closing mechanism for the hand for holding cassettes. This robot 32 can carry up to four cassettes at the same time, and can put one or two cassettes on any place (within the restriction of the range of the Y-shaft movement) according to instruction data. The robot 34 comprises a X-shaft (moving cassette holding hand back and forth), a Z-shaft (up-and-down movement), a θ-shaft (a rotation shaft), and an opening/closing mechanism of a hand. This robot 34 carries cassettes 37 from the transfer lane 24 onto the conveyer 35 by 180° rotation.

The ID-card handling robot 30 takes out up to four ID cards 38, at the same time, from the pocket 51 on a side of a cassette placed under the ID-card handling robot 30, and inserts those ID-cards into the ID-card stocker 31 above the cassettes 37. Conversely, it also takes ID cards 38 from the ID-card stocker 31 and inserts them into the pocket 51 on a side of a cassette.

Figure 5:
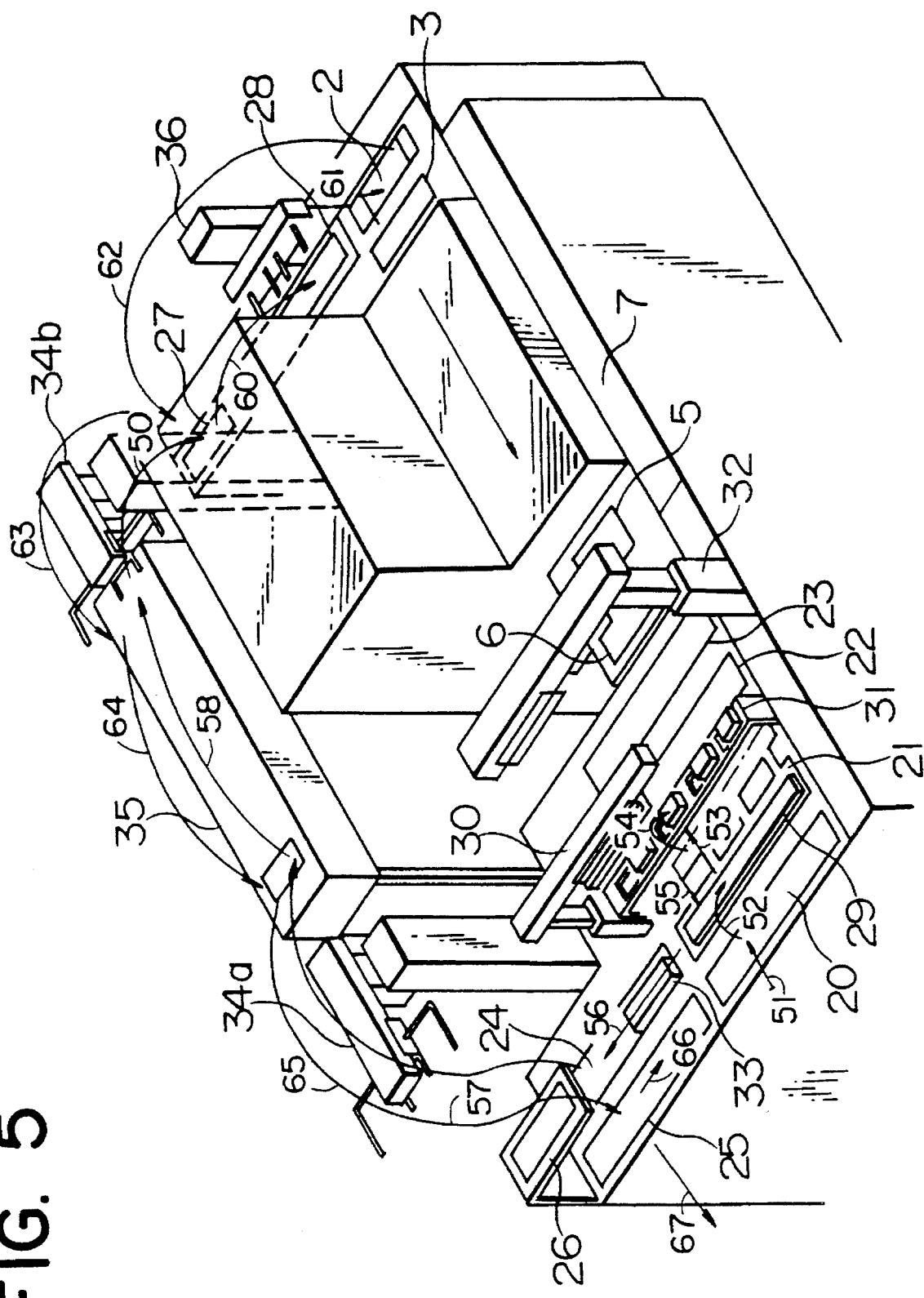
FIG. 5 is a schematic diagram for explanation of the loading sequence of wafers to be cleaned in the equipment shown in FIG. 3.
Figure 6:
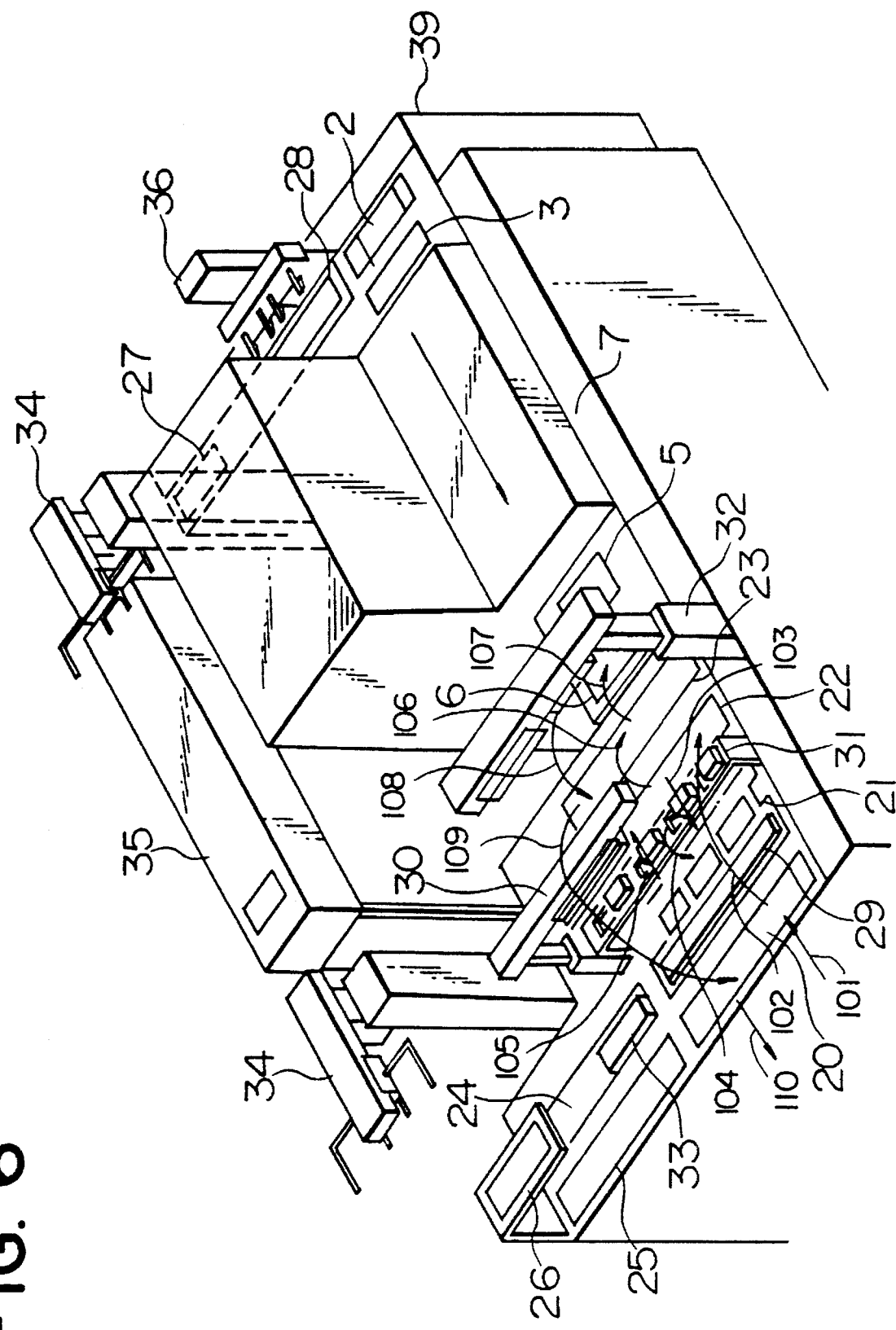
FIG. 6 is a schematic diagram for explanation of the unloading sequence of cleaned wafers from the equipment shown in FIG. 3.

FIG. 5 is a schematic diagram for explanation of the loading sequence of wafers to be cleaned. FIG. 6 is a schematic diagram for explanation of the unloading sequence of cleaned wafers. Incidentally, the wafer cleaning is carried out for up to two cassettes at a time.

First, referring to FIG. 5, the wafer loading sequence is described below. In the following description, step numbers correspond to the numbers in the figure with a surrounding circle.

Step 51: At the beginning of all the steps, four cassettes are put on the carrying-in/carrying-out lane 20. One through four cassettes can be put on it.

Step 52: The robot 32 carries all of these four cassettes at the same time to the ID-card removing lane 21.

Step 53: The slider 29, further, carries all four cassettes at the same time to a place under the ID-card stocker 31.

Step 54: The ID-card handling robot 30 carries four cards (wafers) at the same time to the card stocker 31.

Step 55: The slider 29 carries all four cassettes at the same time to the ID-card removing lane 21.

Step 56: The slider 33 carries two cassettes at a time to the transfer lane 24. Here, the fist two cassettes are called cassette group A, and the latter two cassettes are called cassette group B.

Step 56': The slider 33 carries cassettes of the cassette group B to the proper position so that the robot 34a can take the cassettes. Here, the prime denotes a step concerning the cassette group B.

Step 57: The robot 34a puts cassettes of the cassette group A on the conveyor 35.

Step 58: The conveyor 35 carries cassettes of the cassette group A to the end of the conveyor on the side where the loader 2 is located.

Step 59: The robot 34b carries cassettes of the cassette group A to the transfer lane 27.

Step 60: The robot 36 carries cassettes of the cassette group A to the loader waiting lane 28.

Step 61: The robot 36 places cassettes of the cassette group A on the loader 2. The wafer taking-out unit 3 takes the wafers from cassettes of the cassette group A, thus the cassette group A becomes vacant cassette group A remaining on the loader 2.

Step 57': On condition that the loader waiting lane 28 and the transfer lane 27 are vacant, the robot 34a puts cassettes of the cassette group B on the conveyor 35.

Step 58': The conveyor 35 carries cassettes of the cassette group B to the end of the conveyor on the side where the loader 2 is located.

Step 59': The robot 34b carries cassettes of the cassette group B to the transfer lane 27.

Step 60': The robot 36 carries cassettes of the cassette group B to the loader waiting lane 28.

Step 61': The robot 36 places cassettes of the cassette group B on the loader 2. The wafer taking-out unit 3 takes the wafers from cassettes of the cassette group B, thus the cassette group B becomes vacant cassette group B remaining on the loader 2

Step 62: On condition that the transfer lane 27 is vacant, the robot 36 carries cassettes of the vacant cassette group A to the transfer lane 27.

Step 63: The robot 34b puts cassettes of the vacant cassette group A on the conveyor 35.

Step 64: The conveyor 35 carries cassettes of the vacant cassette group A to the end of the conveyor on the side where the unloader 6 is located.

Step 65: The robot 34a carries cassettes of the vacant cassette group A to the vacant-cassette carrying-out lane 25.

Step 66: The slider 40 puts cassettes of the vacant cassette group A on the vacant-cassette carrying-out lane 25 as far as possible.

Step 62': The robot 36 carries cassettes of the vacant cassette group B to the transfer lane 27.

Step 63': The robot 34b puts cassettes of the vacant cassette group B on the conveyor 35.

Step 64': The conveyor 35 carries cassettes of the vacant cassette group B to the end of the conveyor on the side where the unloader 6 is located.

Step 65': The robot 34a carries cassettes of the vacant cassette group B to the vacant-cassette carrying-out lane 25.

Thus, all four cassettes of the vacant cassette groups A and

B are now ready and the cassettes are carried out of the wafer cleaning equipment 39.

Incidentally, the vacant-cassette buffer lane 26 is used in the following cases:

(1) In case there already exist cassettes on the vacant-cassette carrying-out lane 25 when the cassettes of the vacant cassette group A are carried to the end of the conveyor 35 on the side where the unloader 6 is located, the cassettes of the vacant cassette group A wait for a while on the vacant-cassette buffer lane 26 until the vacant-cassette carrying-out lane 25 becomes available.

(2) When it is required to change the order of positions of the vacant-cassette groups A and B on the vacant-cassette carrying-out lane 25, cassettes of the vacant-cassette group A coming earlier are put on the vacant-cassette buffer lane 26 to wait so that cassettes of the vacant-cassette group B coming later can be put on the vacant-cassette carrying-out lane 25 before the vacant-cassette group A.

Referring to FIG. 6, the unloading sequence of cleaned wafers is described next.

Step 101: On condition that the wafer cleaning equipment 39 with the capability of holding ID cards requires vacant cassettes to be supplied in it, and that the carrying-in/carrying-out lane 20 and the ID-card inserting lane 22 are vacant, four vacant cassettes are put on the carrying-in/carrying-out lane 20.

Step 102: The robot 32 carries these four vacant cassettes at the same time to the ID-card inserting lane 22.

Step 103: The slider 29 carries the four vacant cassettes to the position under the ID-card stocker 31.

Step 104: The ID-card handling robot 30 removes four corresponding ID cards at the same time from the ID-card stocker 31 and inserts them into the vacant cassettes.

Step 105: The slider 29 carries the vacant cassettes with an inserted ID-card to the ID-card inserting lane 22.

Step 106: The robot 32 carries these four cassettes to the unloader waiting lane 23.

Step 107: The robot 32 puts the first group of two cassettes (called cassette group A hereafter), on the unloader 6. The wafer inserting unit 5 inserts cleaned wafers into the cassettes of the cassette group A on the unloader 6.

Step 108: The robot 32 carries the cassettes of the cassette group A back to the unloader waiting lane 23.

Step 107': On the hand, the robot 32 puts the remaining two cassettes (called cassette group B hereafter) on the unloader 6. The wafer inserting unit 5 inserts cleaned wafers into the cassettes of the cassette group B on the unloader 6.

Step 108': The robot 32 carries the cassettes of the cassette group B back to the unloader waiting lane 23.

Step 109: The robot 32 carries all of four cassettes (of both cassette groups A and B) at the same time to the carrying-in/carrying-out lane 20.

Step 110: These four cassettes are carried out of the wafer cleaning equipment 39.

The details of the ID-card handling robot 30 are described in the following.

Figure 7:
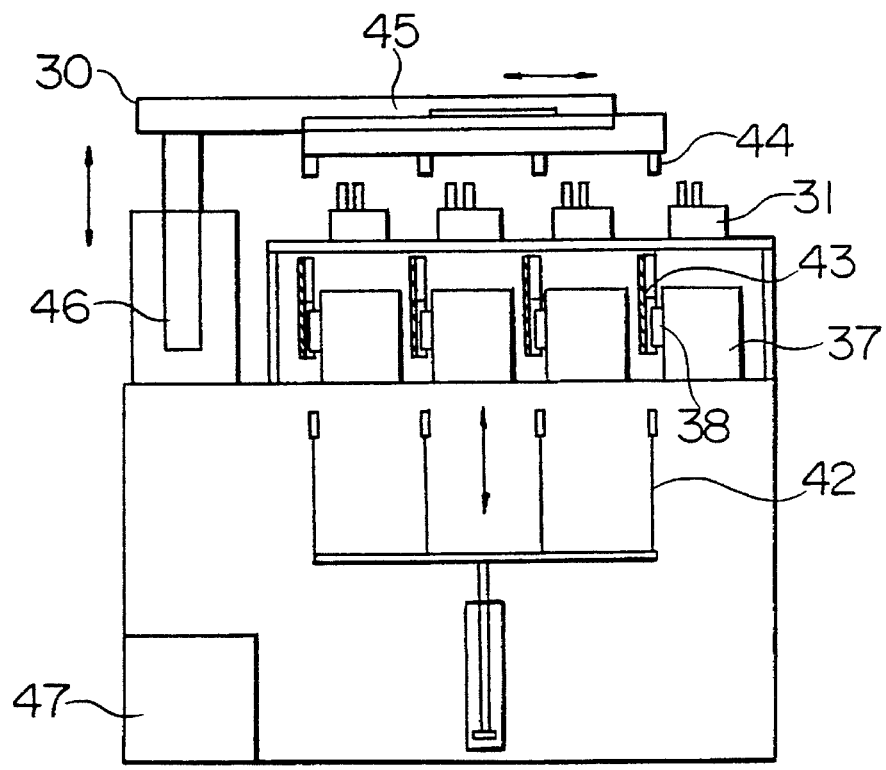
FIG. 7 is a side view showing an ID-card handling robot and the vicinity of it.
Figure 8:
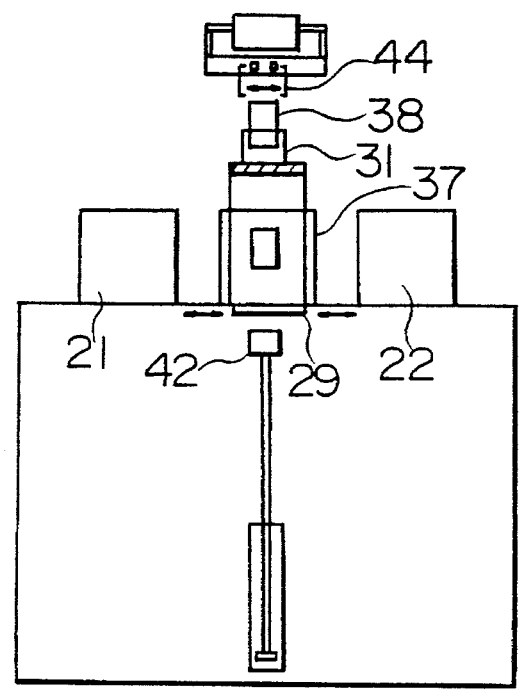
FIG. 8 is an elevational view showing an ID-card handling robot and the vicinity of it.

FIGS. 7 and 8 are respectively a side view and an elevational view showing the ID-card handling robot (main body) 30 and the vicinity of if. In these figures, the ID-card removing lane 21 and the ID-card inserting lane 22 are located on opposite sides of the ID-card handling robot 30. The slider 29 carries cassettes 37 between the ID-card removing lane 21, the ID-card inserting lane 22 and the position just under the ID-card handling robot 30. Furthermore, there is a card guide 43 which functions as a guide when an ID-card 38 is pushed up by a card pusher 42.

The ID-card handling robot 30 comprises a back-and-forth shaft 45 and an up-and-down shaft 46. Here, the back-and-forth shaft moves a gripper 44 back and forth for holding four ID cards 38 at the same time. The up-and-down shaft 46 moves the gripper 44 up and down. Moreover, there is a controller 47 comprising a control unit and a memory unit, wherein the control unit controls the operations of the ID-card handling robot 30, the card pusher 42, and the card guide 43, and wherein the memory unit contains card position data for each ID card 38 held in the card stocker 31.

Figure 9:
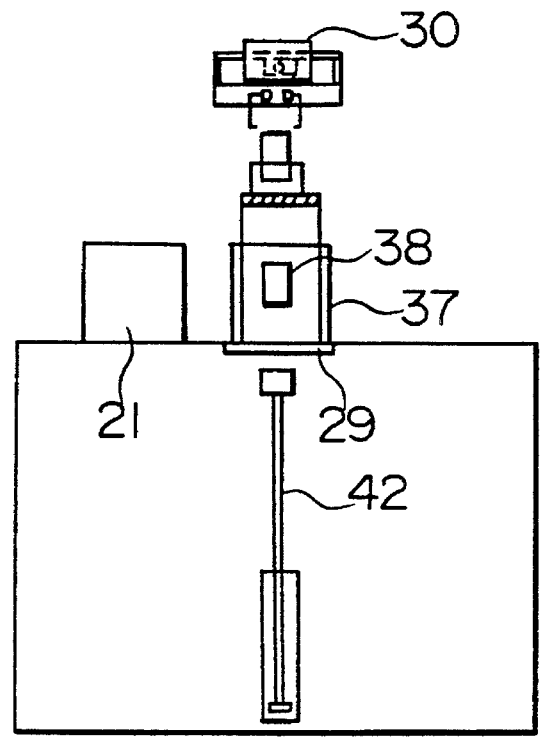
FIG. 9 is an elevational view showing an ID-card handling robot and the vicinity of it for explanation of the operation of removing and keeping an ID card.
Figure 10:
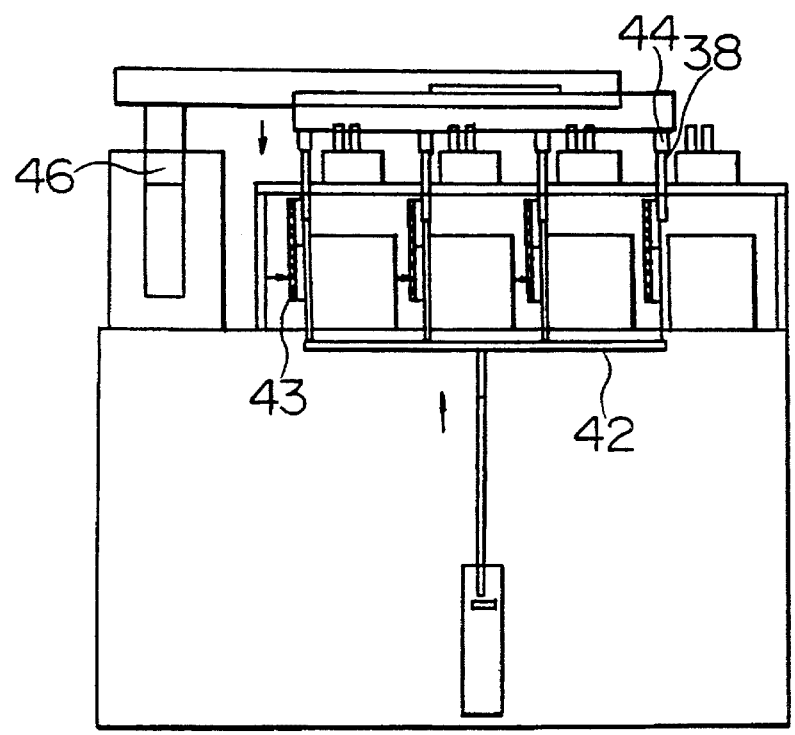
FIG. 10 is a side view showing an ID-card handling robot and the vicinity of it for explanation of the operation of removing and keeping an ID card.
Figure 11:
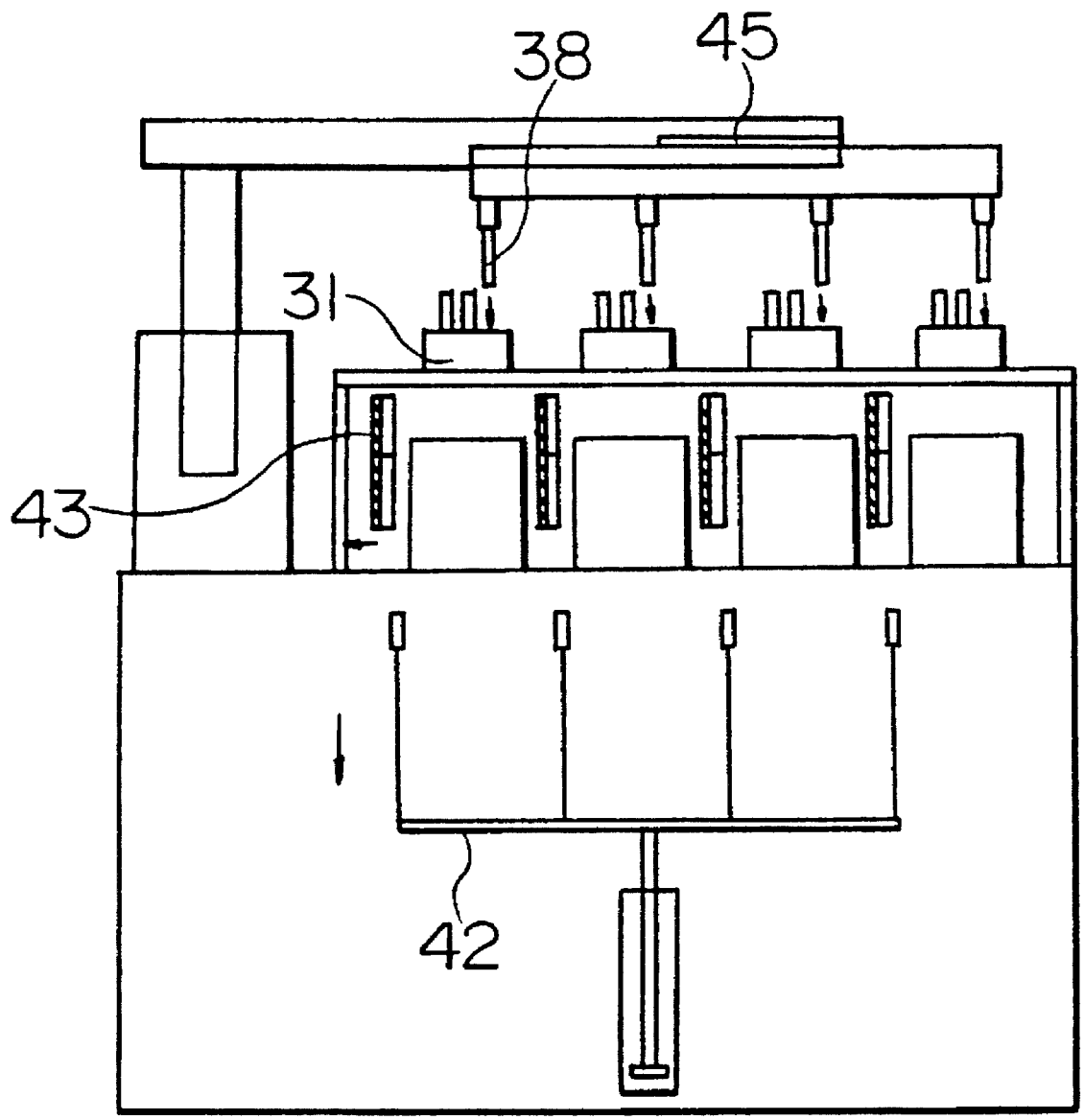
FIG. 11 is a side view showing an ID-card handling robot and the vicinity of it for explanation of the operation of removing and keeping an ID card.

The ID-card handling robot 30 operates as follows:

FIGS. 9–11 are schematic diagrams for explanation of how ID cards are removed and held. FIG. 9 is an elevational view showing the ID-card handling robot 30 and the vicinity of it, and FIGS. 10 and 11 are a side view of it. Referring to these figures, ID cards are removed and held according to the following steps (1)–(3).

(1) The slider 29 carries a cassette on the ID-card removing lane 21 to the position under the ID-card handling robot 30.

(2) After the card guide 43 moves to the vicinity of ID cards, the card pusher 42 pushes up the ID cards 38. Furthermore, the gripper 44 of the ID-card handling robot 30 holds these ID cards 38.

(3) The back-and-forth shaft 45 and the up-and-down shaft 46 of the ID-card handling robot 30 are moved to put the ID cards 38 in the card stocker 31.

Furthermore, ID cards 38 are inserted into cassettes according the steps opposite to the above steps (1)–(3), with a slight difference, that is, cassettes are carried by the slider 29 from the ID-card inserting lane 22 to the position just under the ID-card handling robot 30.

Figure 12:
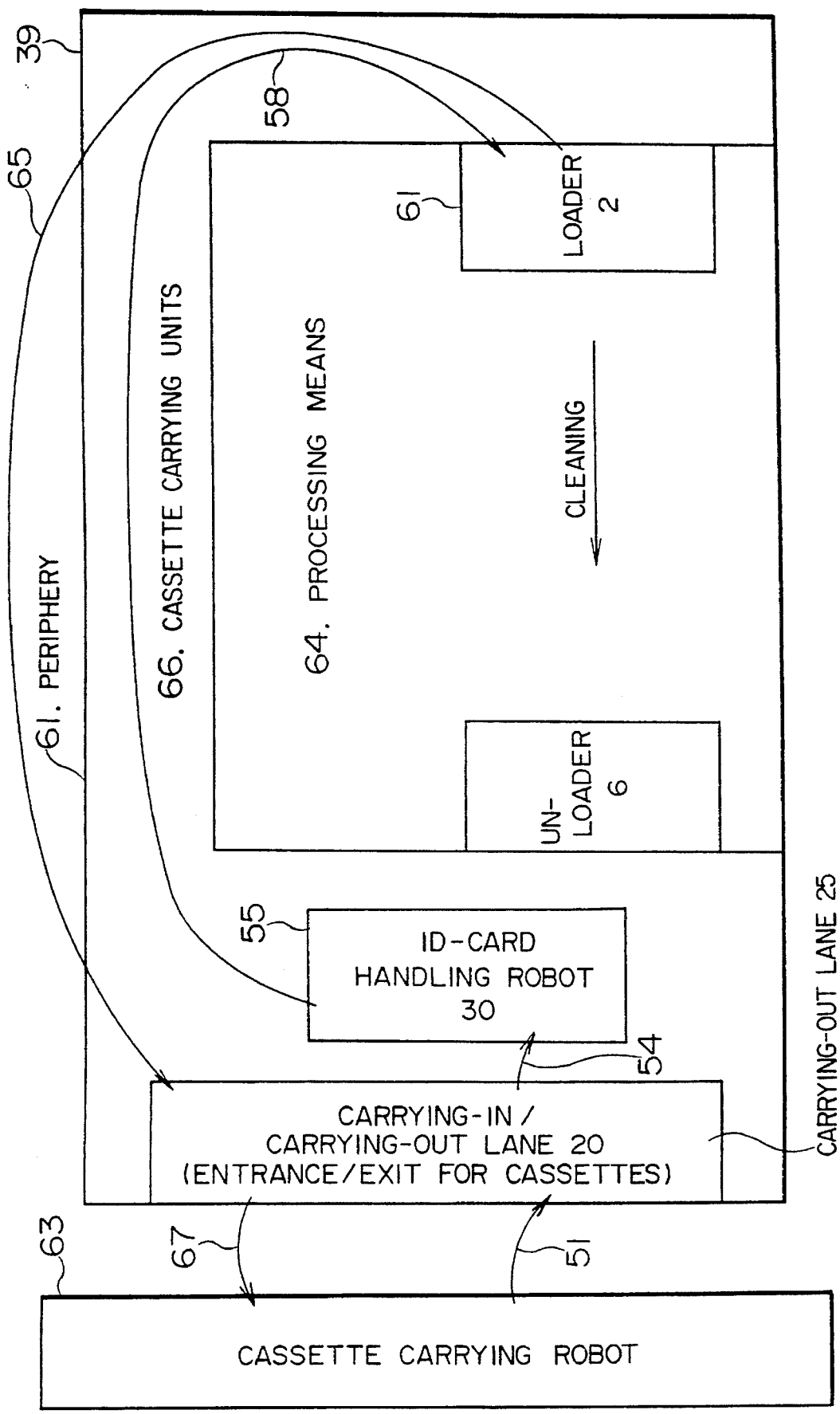
FIG. 12 is a schematic diagram showing an embodiment of wafer cleaning equipment for explanation of the loading sequence of wafers to be cleaned.
Figure 13:
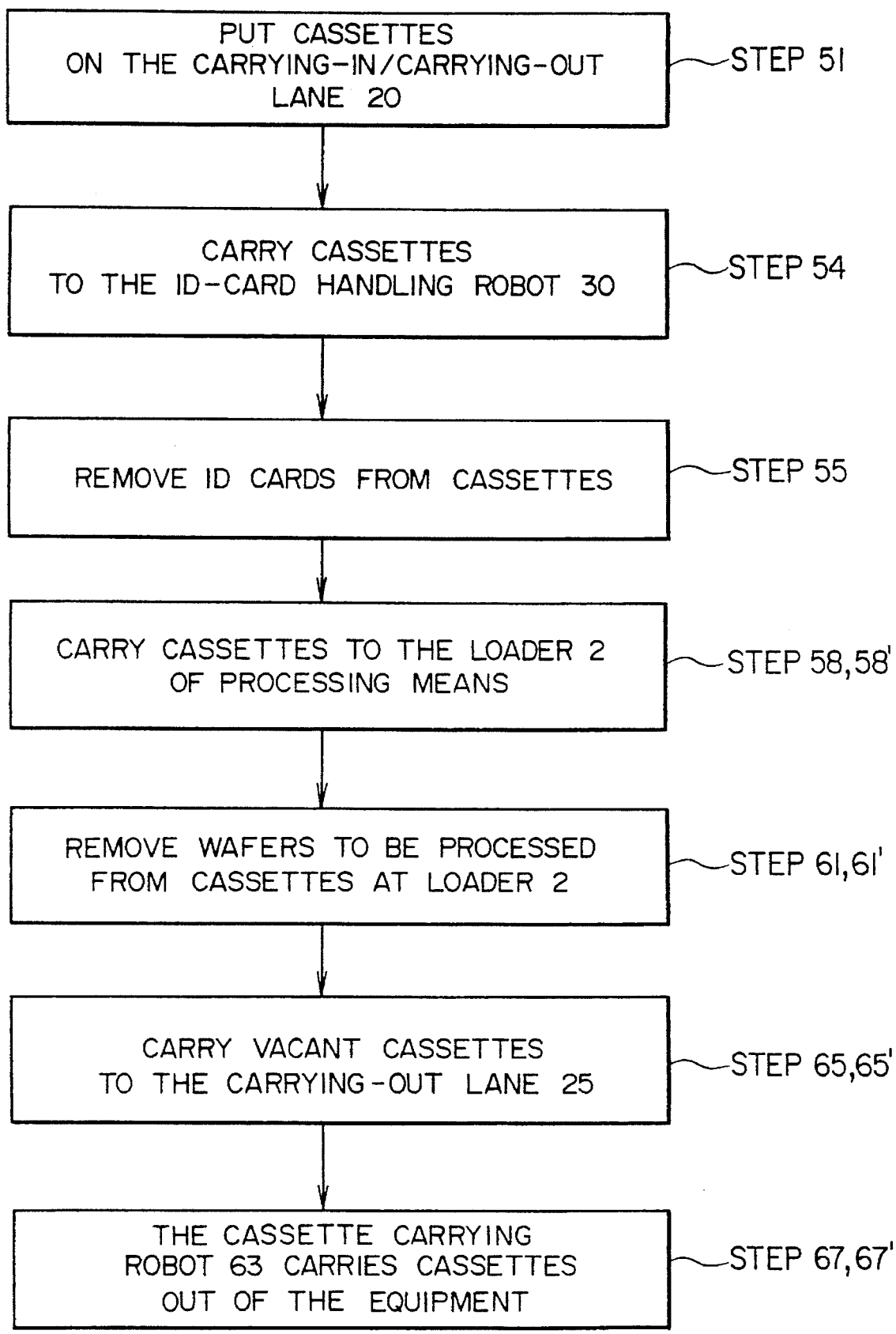
FIG. 13 is a flowchart showing the loading sequence of wafers to be cleaned.
Figure 14:
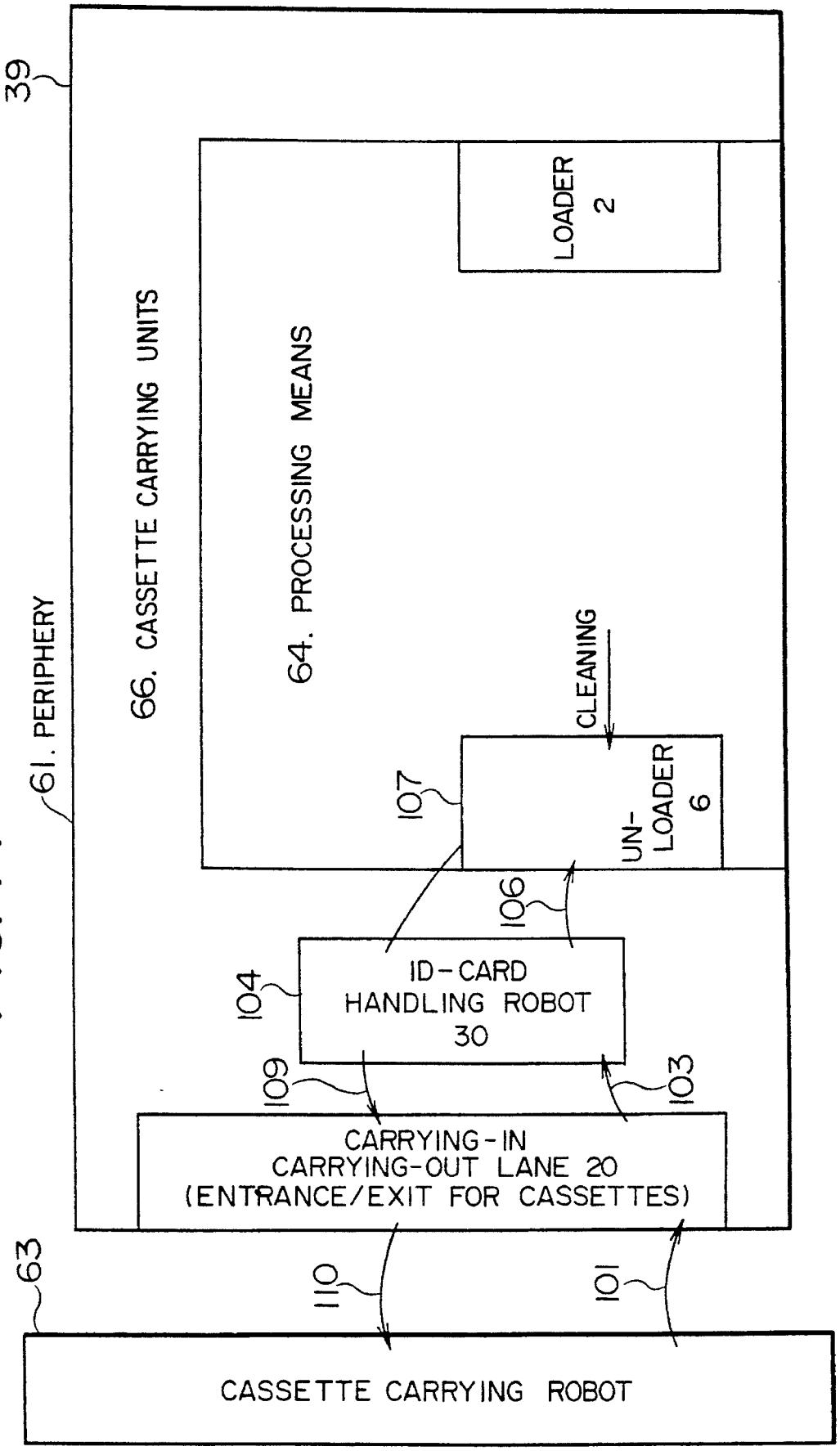
FIG. 14 is a schematic diagram showing an embodiment of wafer cleaning equipment for explanation of the unloading sequence of cleaned wafers.
Figure 15:
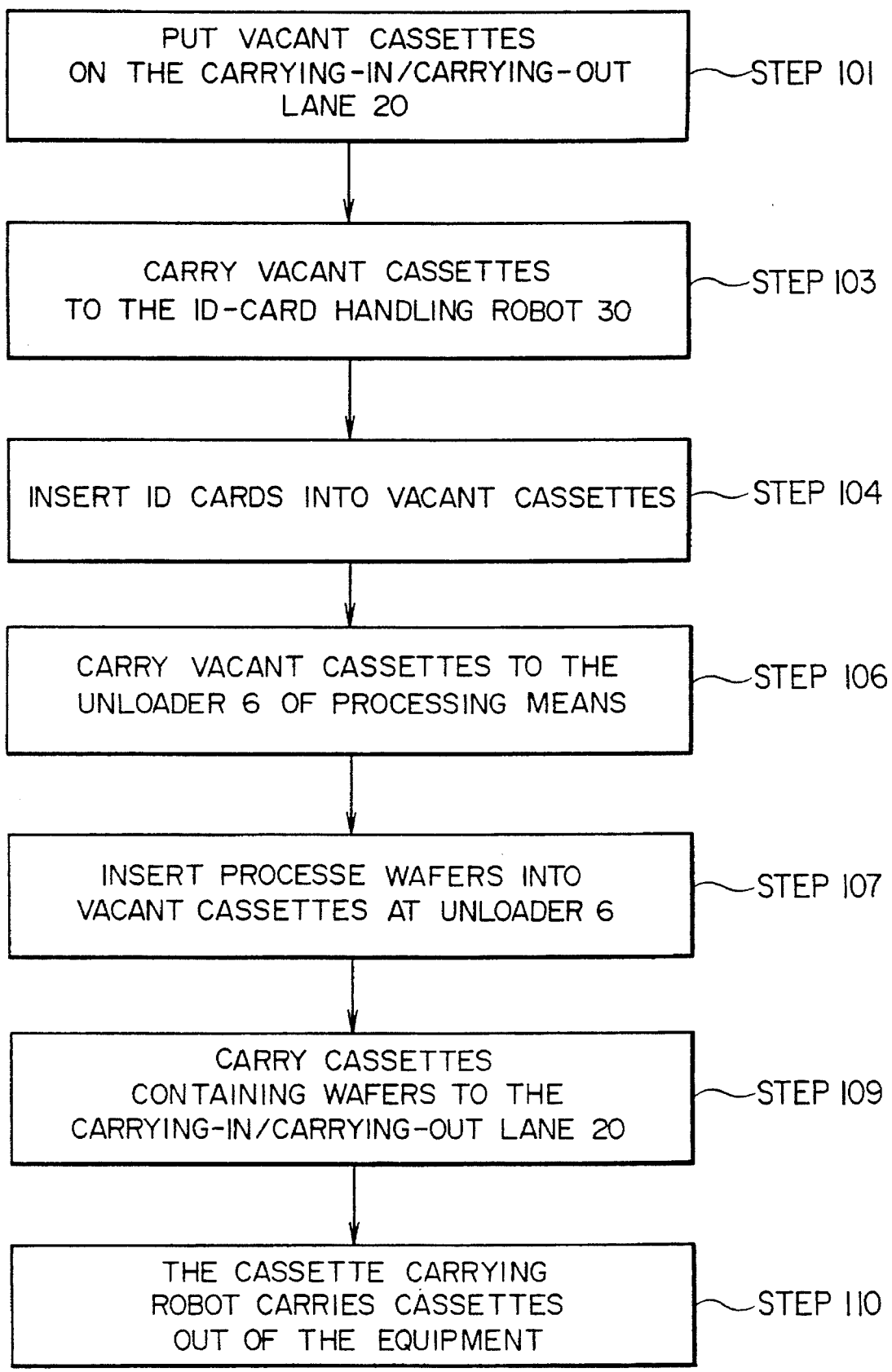
FIG. 15 is a flowchart showing the unloading sequence of cleaned wafers.

In addition to the above descriptions which show the loading sequence for wafers to be cleaned and the unloading sequence for cleaned wafers according to the first embodiment of the present invention, further descriptions are given in FIGS. 12–15 to show major points of these sequences. FIGS. 12 and 13 are a schematic diagram and a flowchart respectively for explanation of the loading sequence of wafers to be cleaned. FIGS. 13 and 14 are a flowchart and a schematic diagram respectively for explaining of the unloading sequence of cleaned wafers.

Second Embodiment

Referring to the figures, a second embodiment of the present invention is described below.

Figure 16:
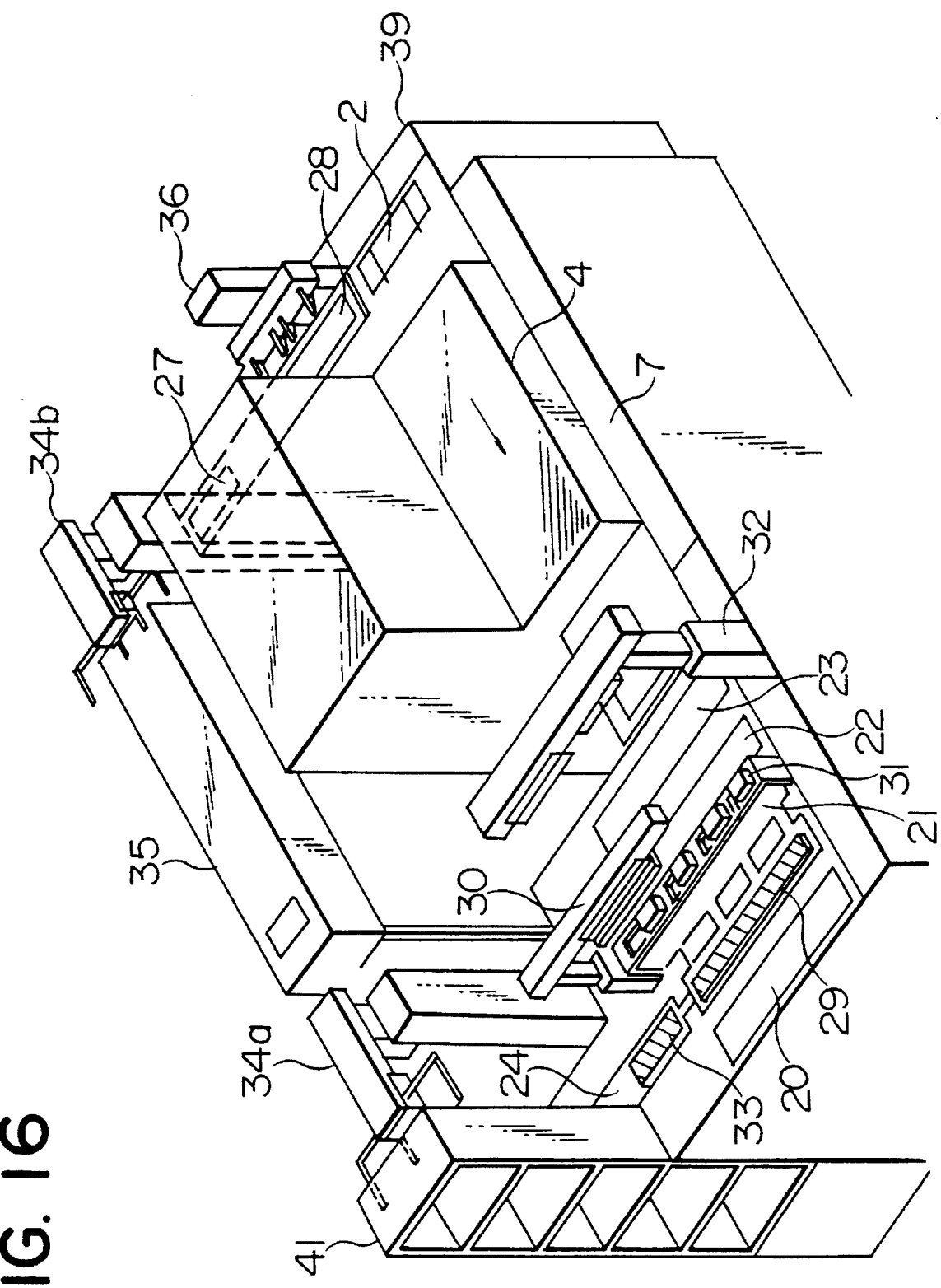
FIG. 16 is a schematic diagram showing an embodiment of wafer cleaning equipment of a second embodiment of the present invention.
Figure 17:
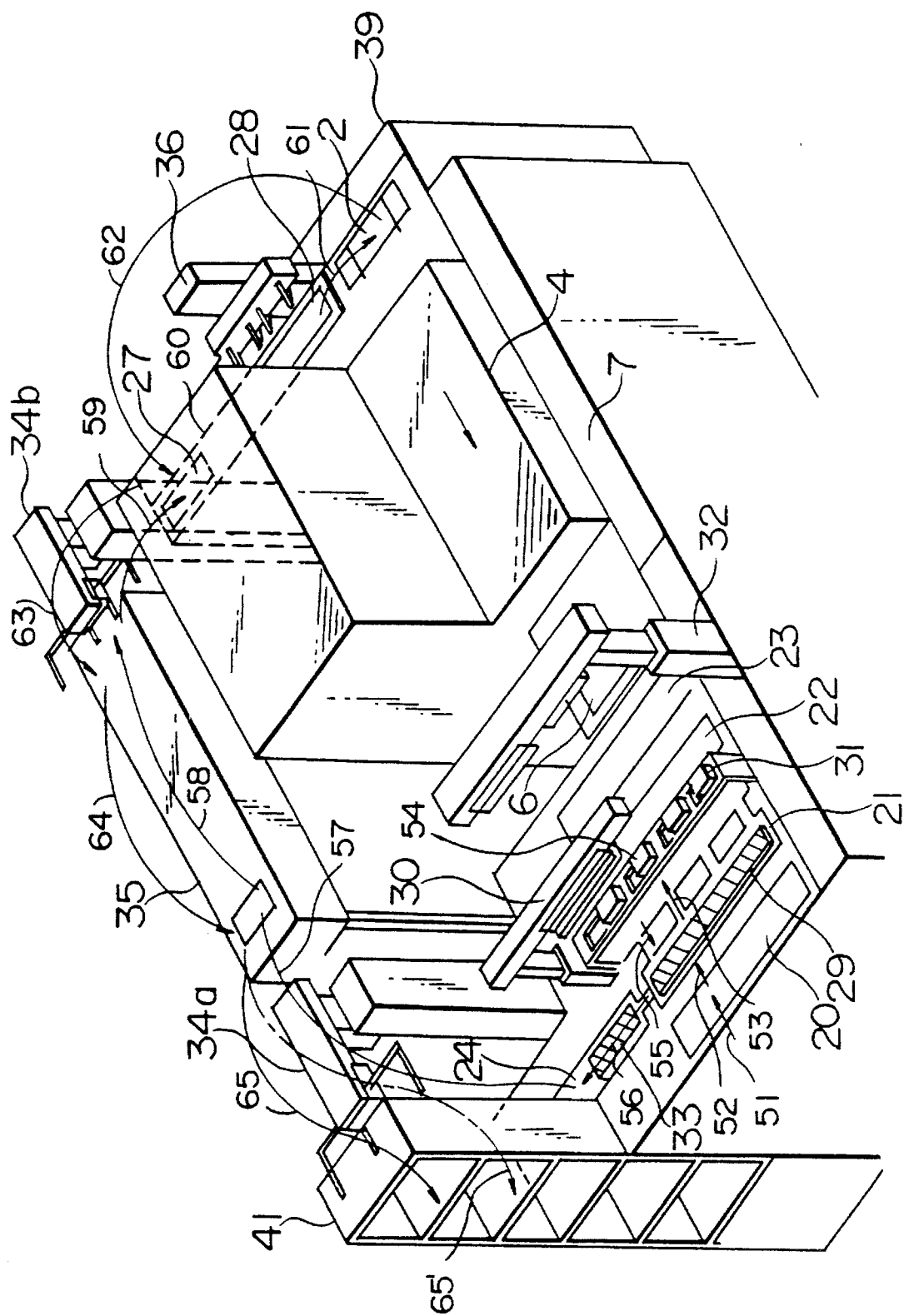
FIG. 17 is a schematic diagram for explanation of the loading sequence of wafers to be cleaned in the equipment shown in FIG. 16.
Figure 18:
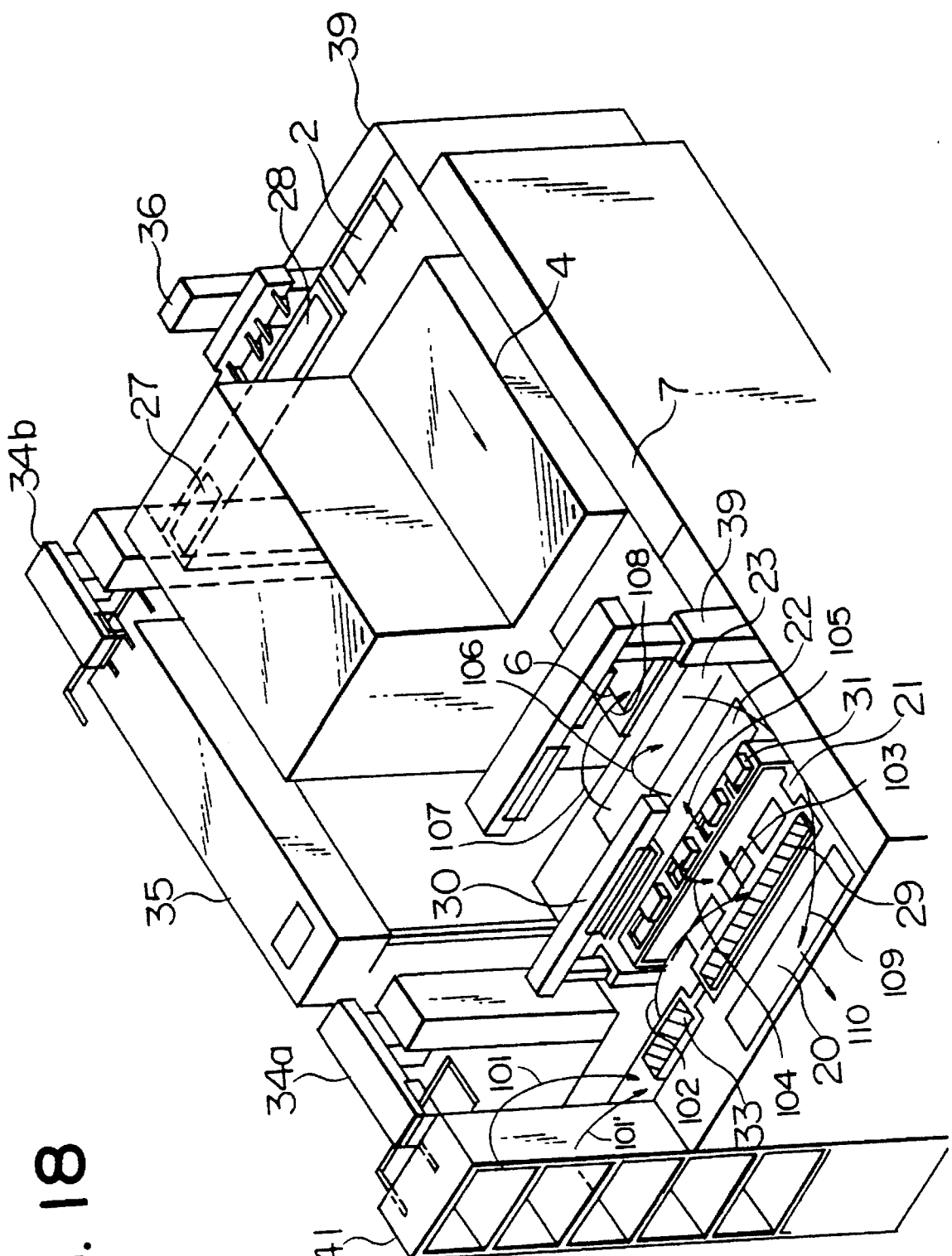
FIG. 18 is a schematic diagram for explanation of the unloading sequence of cleaned wafers from the equipment shown in FIG. 16.

FIG. 16 is a schematic diagram of wafer cleaning equipment with capability of holding ID cards in accordance with the second embodiment of the present invention. FIG. 17 is a schematic diagram for explanation of the loading sequence of wafers to be cleaned which is performed using the equipment shown in FIG. 16. FIG. 18 is a schematic diagram for explanation of the unloading sequence of cleaned wafers which is performed using the equipment shown in FIG. 16. In these figures, members of the equipment of the second embodiment are the same as those of the equipment of the first embodiment, except for the vacant-cassette stocker 41 of the second embodiment which is provided instead of the vacant-cassette carrying-out lane 25 of the first embodiment. Accordingly, the basic description of the second embodiment is made with the help of the reference numerals used in the first embodiment, and different matters are mainly explained.

First, the loading sequence of wafers to be cleaned is described below, referring to FIG. 17.

Steps 51–64: The same as those in the first embodiment.

Step 65: The robot 34 carries the cassettes of vacant-cassette group A to the vacant-cassette stocker 41.

Step 66 of the first embodiment-putting cassettes on the lane as far as possible-is not carried out in the second embodiment.

Step 65': The robot 34 carries the cassettes of vacant-cassette group B to the vacant-cassette stocker 41.

Step 67: Four cassettes (cassettes of the vacant-cassette groups A and B) are stocked in the vacant-cassette stocker 41. Incidentally, there is no operation related to a vacant-cassette carrying-out lane 25, because no vacant-cassette carrying-out lane 25 is provided.

Referring to FIG. 18, the unloading sequence of cleaned wafers is described next.

Step 101: The robot 34a carries two vacant cassettes (cassettes of the vacant-cassette group A) from the vacant-cassette stocker 41 to the transfer lane 24.

Step 102: The slider 33 carries these vacant cassettes to the ID-card removing lane 21.

Step 101': The robot 34a carries two remaining vacant cassettes (cassettes of the vacant-cassette group B) from the vacant-cassette stocker 41 to the transfer lane 24.

Step 102': The slider 33 carries these vacant cassettes to the ID-card removing lane 21.

Steps 103–110: The same as those in the first embodiment.

Figure 19:
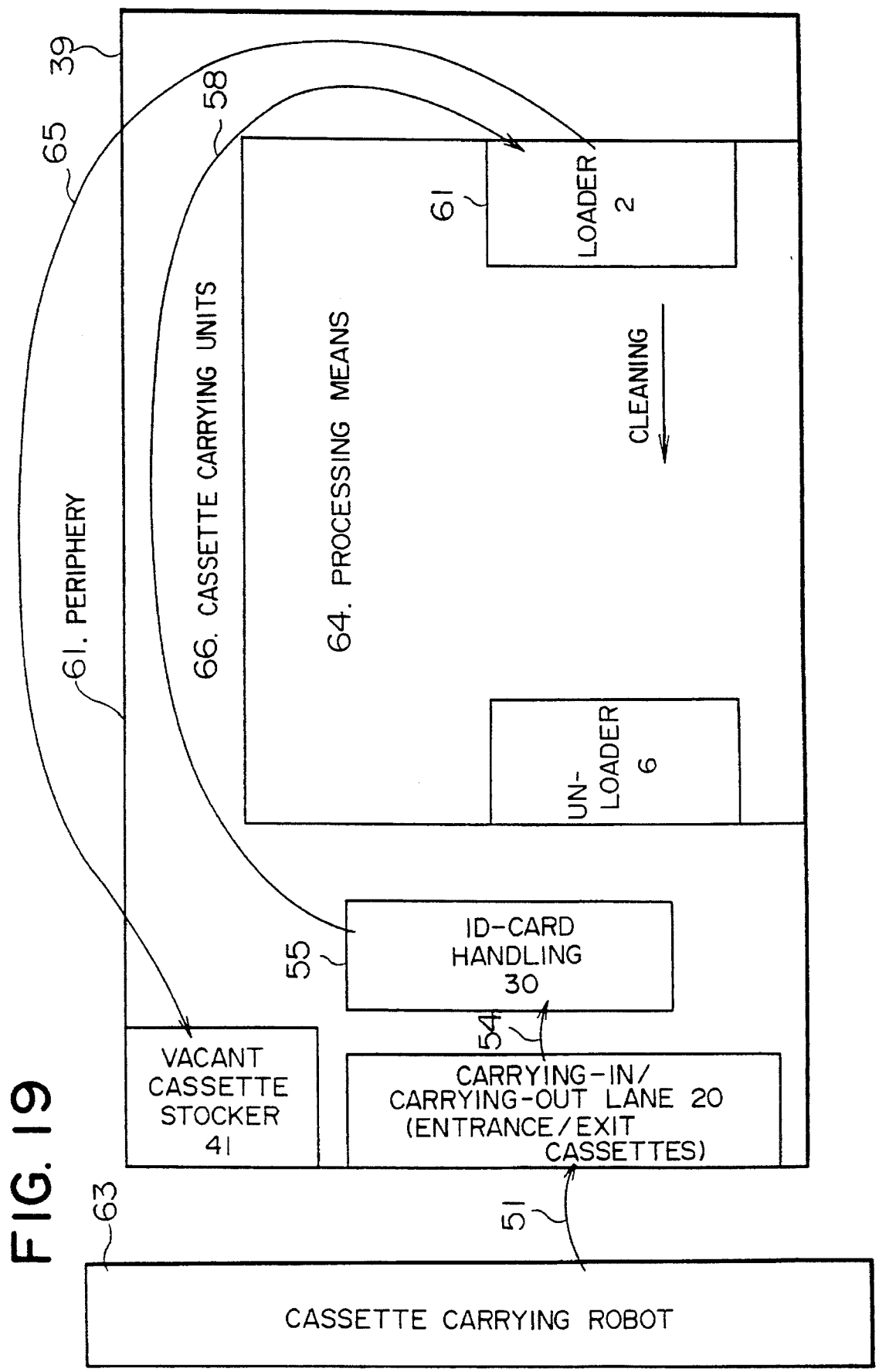
FIG. 19 is a schematic diagram for explanation of the loading sequence of wafers to be cleaned.
Figure 20:
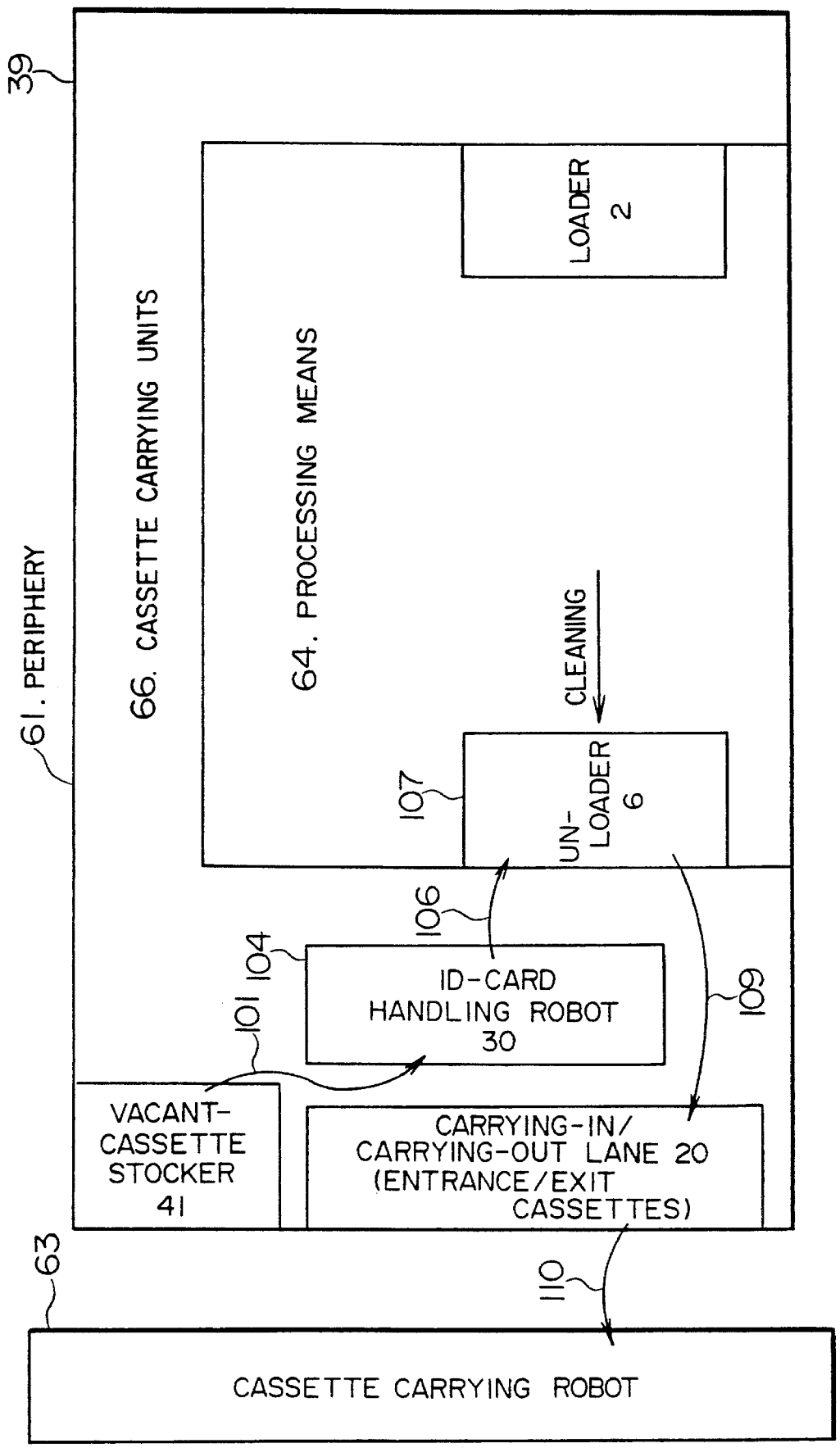
FIG. 20 is a schematic diagram for explanation of the unloading sequence of cleaned wafers.

In addition to the above descriptions which show the loading sequence for wafers to be cleaned and the unloading sequence for cleaned wafers according to the second embodiment of the present invention, further descriptions are given in FIGS. 19 and 20 to show major points of these sequences. FIG. 19 is a schematic diagram for explanation of the loading sequence of wafers to be cleaned. FIG. 20 is a schematic diagram for explanation of the unloading sequence of cleaned wafers. In the second embodiment, the vacant-cassette stocker 41 provided inside the equipment eliminates the necessity to carry vacant cassettes out of the equipment, thus it results in the reduction in the number of robots for carrying vacant cassettes.

Third Embodiment

Figure 21:
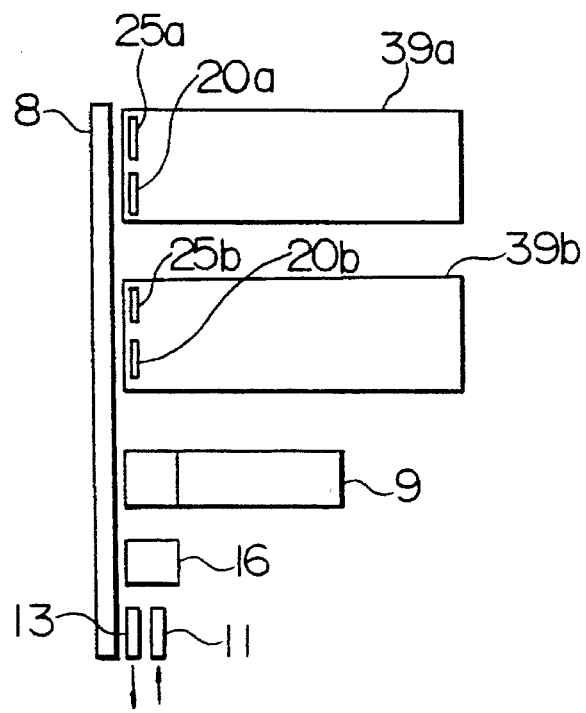
FIG. 21 is a schematic diagram showing an embodiment of a wafer cleaning module of a third embodiment of the present invention.

In the following, a semiconductor processing equipment module of the present invention is described. FIG. 21 is a schematic diagram showing a semiconductor processing equipment module, such as a wafer cleaning module, using wafer cleaning equipment with capability of holding ID cards as shown in the first embodiment. In this figure, a robot 8, a case (cassette) carrying means, carries up to four cassettes between cassette cleaning equipment 9 as case (cassette) cleaning means, a module carrying-in lane 11, a module carrying-out lane 13, a case (cassette) stocker 16 as a case stocking means, carrying-in/carrying-out lanes 20a and 20b and a vacant-cassette carrying-out lanes 25a and 25b of each of two pieces of wafer cleaning equipment 39a and 39b.

Figure 22:
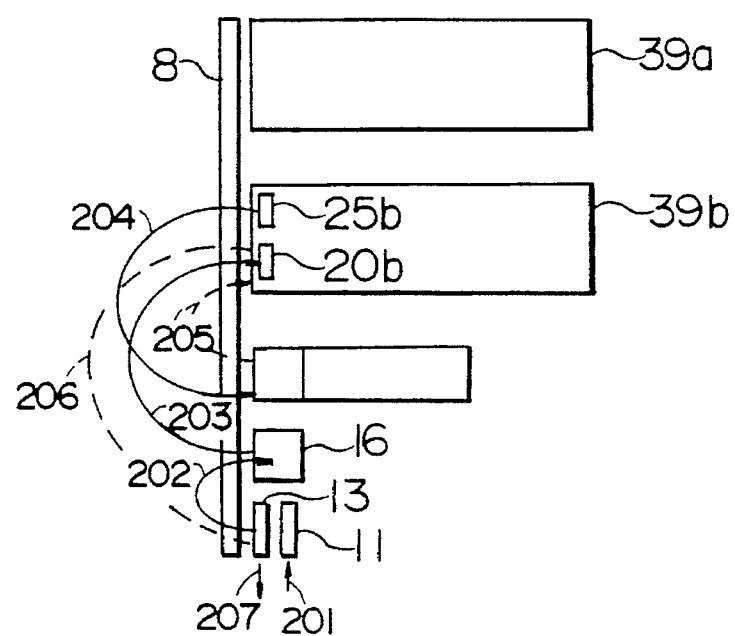
FIG. 22 is a schematic diagram for explanation of the flow of cassettes in the wafer cleaning module shown in FIG. 21.

Referring to FIG. 22, the flow of cassettes in the wafer cleaning module is described below.

Step 201: Four wafer cassettes are put on the module carrying-in lane 11. (One through four cassettes can be put on it.)

Steps 202 and 203: The robot 8 carries these cassettes either to the cassette stocker 16 or directly to the carrying-in/carrying-out lane 20b of the wafer cleaning equipment 39b. Four vacant cassettes from which wafers have been removed in the wafer cleaning equipment 39b are carried to the vacant-cassette carrying-out lane 25b.

Step 204: The robot 8 carries these four vacant cassettes to the cassette cleaning equipment 9. The cassettes are stocked after they are cleaned in the cassette cleaning equipment 9.

Step 205: The robot 8 carries some number of vacant cassettes which the wafer cleaning equipment 39b requires from the cassette cleaning equipment 9 to the carrying-in/carrying-out lane 20b. Then, at the wafer cleaning equipment 39b, cleaned wafers are inserted into the vacant cassettes and the cassettes are carried to the carrying-in/carrying-out lane 20b.

Step 206: The robot 8 carries these cassettes containing cleaned wafers either to the cassette stocker 16 or directly to the module carrying-out lane 13. Cassettes which are carried into the cassette stocker 16 are carried to the module carrying-out lane 13 at an appropriate time by the robot 8.

Step 207: The cassettes containing cleaned wafers are carried out from the module carrying-out lane 13.

Operations similar to the above are also performed for the wafer cleaning equipment 39a.

Fourth Embodiment

Figure 23:
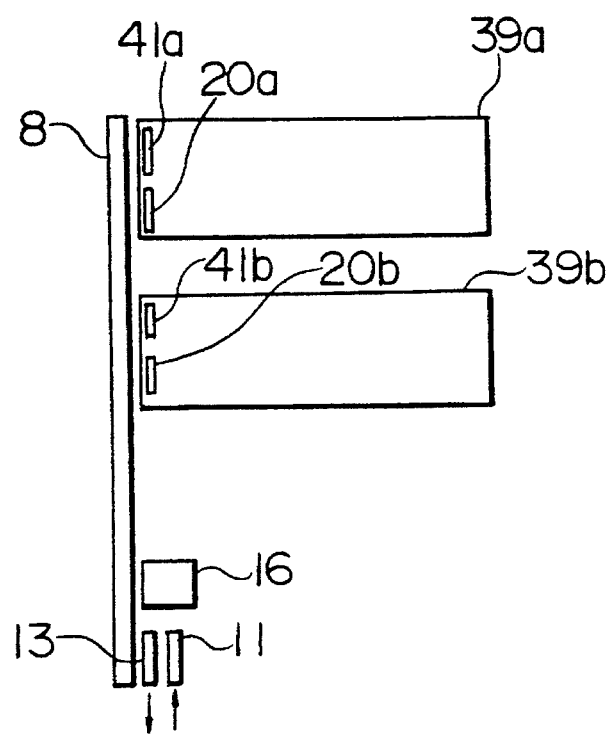
FIG. 23 is a schematic diagram showing an embodiment of a wafer cleaning module of a fourth embodiment of the present invention.

FIG. 23 is a schematic diagram showing a wafer cleaning module using wafer cleaning equipment with capability of holding ID cards shown in the second embodiment. In this figure, a robot 8 carries up to four cassettes between a module carrying-in lane 11, a module carrying-out lane 13, a case (cassette) stocker 16, and carrying-in/carrying-out lanes 20a and 20b of each of two pieces of wafer cleaning equipment 39a and 39b. The fourth embodiment is basically the same as the third embodiment with the exception that a vacant-cassette carrying-out lane 25 is replaced by a vacant-cassette stocker 41 (41a and 41b).

Figure 24:
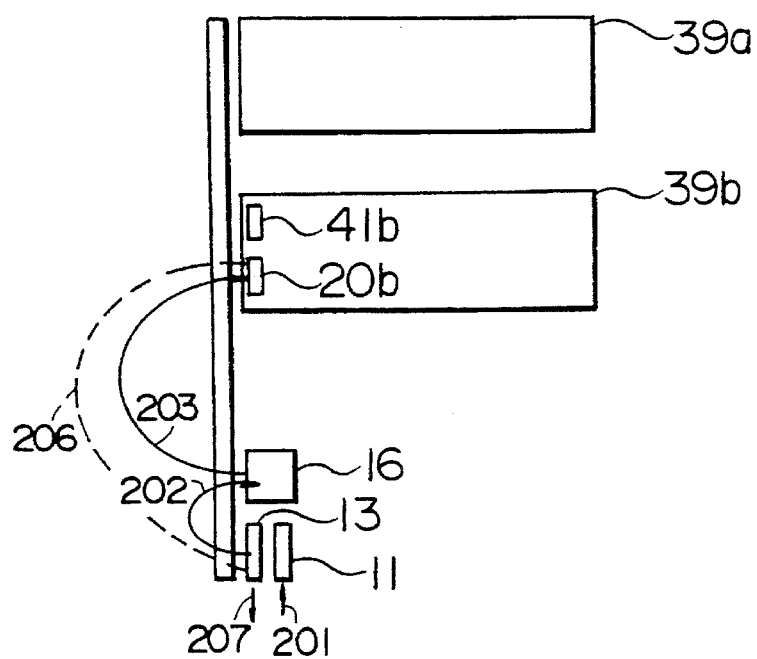
FIG. 24 is a schematic diagram for explanation of the flow of cassettes in the wafer cleaning module shown in FIG. 23.
Figure 25:
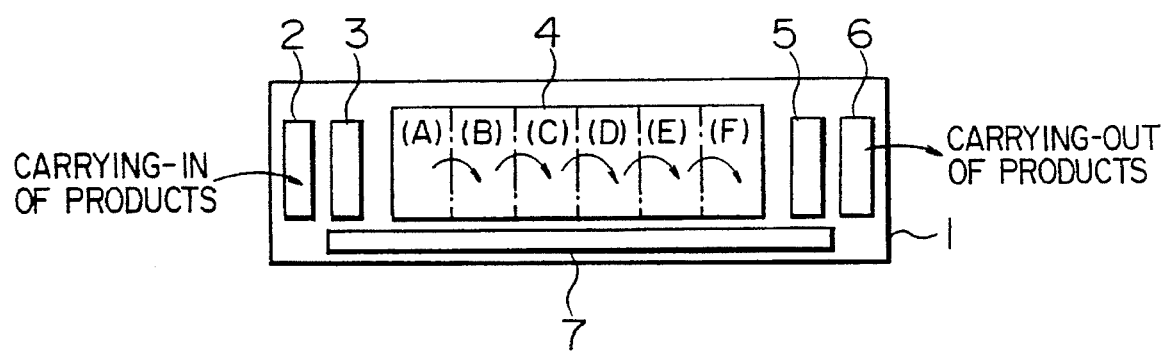
FIG. 25 is a schematic diagram showing a conventional wafer cleaning equipment.

Referring to FIG. 24, the flow of cassettes in the wafer cleaning module is described below.

Step 201: Four wafer cassettes are put on the module carrying-in lane 11. (One through four cassettes can be put on it.)

Steps 202 and 203: The robot 8 carries these cassettes either to the cassette stocker 16 or directly to the carrying-in/carrying-out lane 20b of the wafer cleaning equipment 39b. Four vacant cassettes from which wafers have been removed in the wafer cleaning equipment 39b are carried to the vacant-cassette stocker 41b.

Steps 204 and 205: There are no steps corresponding to the steps 204 and 205 of the third embodiment, but at the wafer cleaning equipment 39b, cleaned wafers are inserted into the vacant cassettes and the cassettes are carried to the carrying-in/carrying-out lane 20b.

Step 206: The robot 8 carries these cassettes containing cleaned wafers either to the cassette stocker 16 or directly to the module carrying-out lane 13. Cassettes which are carried into the cassette stocker 16 are carried to the module carrying-out lane 13 at an appropriate time by the robot 8.

Step 207: The cassettes containing cleaned wafers are carried out from the module carrying-out lane 13.

Operations similar to the above are also performed for the wafer cleaning equipment 39a.

As described above, the present invention makes it possible to perform full ID-card management inside equipment. The present invention also makes it possible to achieve a reduction in equipment sizes, and also high efficiency factory automation. Furthermore, the carrying path of cases can be simplified and the number of carrying means such as robots can be reduced. Besides, it is possible to arrange a plurality of items of semiconductor processing equipment in parallel so that cases can be carried to/from only one side of the equipment, thus the number of case carrying means can be reduced and a size reduction can be achieved for modules to achieve the factory automation.

What is claimed is:

1. A semiconductor processing method comprising the steps of:

transporting an incoming case containing semiconductor wafers to be processed to a first side of a semiconductor processing device;

removing an ID card identifying the semiconductor wafers from the incoming case at the first side of the processing device and storing the ID card;

moving the incoming case from the first side to a second side of the processing devise spaced from the first side;

loading the semiconductor wafers from the incoming case into the processing device at the second side;

processing the semiconductor wafers in the processing device;

disposing an outgoing case for processed wafers at the first side of the processing device;

attaching the ID card to the outgoing case;

unloading the processed semiconductor wafers from the processing device into the outgoing case at the first side of the processing device; and transporting the outgoing case away from the first side of the processing device.

2. The method according to claim 1 wherein the first and second sides are on opposite sides of the processing device.

3. The method according to claim 1 wherein attaching the ID card comprises disposing the ID card in an external pocket of the outgoing case.

4. The method according to claim 1 wherein removing the ID card comprises removing the ID card from an external pocket of the incoming case.

5. The method according to claim 1 including returning the incoming case to the first side of the processing device after removing the semiconductor wafers from the incoming case.

6. The method according to claim 5 wherein returning the incoming case to the first side of the processing device comprises disposing the incoming case in a storage area.

7. The method according to claim 6 wherein disposing the outgoing case at the first side comprises removing the outgoing case from the storage area.

8. The method according to claim 5 including transporting the incoming case from the first side after returning the incoming case to the first side.

9. The method according to claim 1 including reusing the incoming case as an outgoing case.

10. The method according to claim 1 comprising removing and attaching the ID card with a robot.

\* \* \* \* \*